United States Patent [19]
Johnston et al.

[11] Patent Number: 5,892,377
[45] Date of Patent: Apr. 6, 1999

[54] METHOD AND APPARATUS FOR REDUCING LEAKAGE CURRENTS IN AN I/O BUFFER

[75] Inventors: Robert James Johnston, Fair Oaks; Joseph Harold Salmon, Placerville, both of Calif.

[73] Assignee: Intel Corporation, Santa Clara, Calif.

[21] Appl. No.: 621,395

[22] Filed: Mar. 25, 1996

[51] Int. Cl.[6] ................................................ H03K 3/00
[52] U.S. Cl. ...................... 327/108; 327/170; 327/377; 327/437; 327/540; 326/83; 326/86
[58] Field of Search ................... 327/108–112, 374–377, 327/170, 379, 389, 391, 427, 434, 437, 540, 382, 383, 387, 309, 310, 312, 314, 318–324, 331, 332; 326/21, 27, 81, 83

[56] References Cited

U.S. PATENT DOCUMENTS

| | | | |
|---|---|---|---|
| 5,315,187 | 5/1994 | Cheng | 327/384 |
| 5,381,059 | 1/1995 | Douglas | 326/58 |
| 5,444,397 | 8/1995 | Wong et al. | 326/81 |
| 5,512,844 | 4/1996 | Nakakura et al. | 326/27 |
| 5,576,635 | 11/1996 | Partovi et al. | 326/27 |

*Primary Examiner*—Kenneth B. Wells
*Attorney, Agent, or Firm*—Blakely, Sokoloff, Taylor & Zafman

[57] ABSTRACT

A method and apparatus for reducing leakage currents in a high voltage tolerant I/O buffer. An I/O buffer designed to tolerate high external voltages by blocking such voltages at a passgate in a p-output path that uses a device between a p-driver gate node and a p-gate node of the passgate to ensure that the p-transistor of the passgate is turned on when the p-driver is driving the pad high. A second device isolates the p-gate node of the passgate from the pad until a pad voltage reaches a predetermined level. Once the pad voltage reaches the predetermined level, the device drives the voltage at the p-gate node of the passgate to that of the pad. Maintaining the p-transistor of the passgate on while the p-driver is driving the pad high allows a rapid hard shut-off of the p-driver as the I/O buffer tri-states the pad. Additionally, the second device maintains the necessary voltage protection by insuring a hard shut-off of the p-transistor of the passgate when the voltage at the pad reaches a predetermined level.

14 Claims, 3 Drawing Sheets

METHOD AND APPARATUS FOR REDUCING LEAKAGE CURRENTS IN AN I/O BUFFER

BACKGROUND OF THE INVENTION

(1) Field of the Invention

The invention relates to an I/O buffer. More specifically, the invention relates to improving the leakage currents characteristics of the p-output path of a five volt tolerant I/O buffer.

(2) Related Art

Input/output (I/O) buffers are generally well-known in the art. Early semiconductor processes were designed to operate in the voltage range of zero to five volts. Lower power processes have been developed such that some existing semiconductor processes are designed to use lower voltage ranges. For example, CMOS technologies frequently operate between the power supply voltage ($V_{cc}$) of 3.3 volts and ground. Because such circuits are often used in an environment having components which still require a 5 volt range, it is necessary to devise a lower voltage circuit that operates in a higher voltage environment. Different voltage ranges are increasingly common, and voltage protection is necessary any time a lower voltage chip resides in a higher voltage environment. For example, if the CMOS chipset shares a bus with a typical dynamic random access memory (DRAM) interface, when the chipset tri-states its I/O buffer and samples the bus, signals may be driven back at five volts. Thus, the I/O buffer must be designed to tolerate five volts without a functionality or reliability problem. To do this, it is desirable to prevent the five volts from passing through the I/O buffer to the chipset itself.

FIG. 1 shows a prior art circuit employed in an output buffer to accomplish the necessary protection and reliability in a five volt environment In the p-output path, p-predriver 1 drives a signal into passgate 14 which is composed of an n-type transistor 8 and p-type transistor 9. N-type transistor 8 has a gate coupled to a supply voltage $V_{cc}$ while its other two terminals are connected to the corresponding terminals of the p-type transistor 9. The drains of transistors 8 and 9 are coupled to the gate 10 of p-driver 6 which is also a p-type transistor. The source terminal of the p-driver is connected to a peripheral power supply ($V_{ccp}$), and the drain is connected to pad 5. $V_{ccp}$ is nominally the same voltage as $V_{cc}$, however, because of noise considerations, it is common practice to employ a separate power rail for the p-driver and peripherals. One could, of course, couple the p-driver 6 to $V_{cc}$ instead. One of ordinary skill in the art will also recognize the p-type transistors have a fourth terminal providing a necessary N-well bias. N-well biasing is performed in a manner consistent with high voltage tolerant design. This fourth terminal is omitted throughout for clarity.

One of ordinary skill in the art will recognize that the transistors are symmetric. Stated differently, defining a particular terminal to be a source or drain is arbitrary as the source or drain is actually defined by the voltage relative to the gate voltage of a particular transistor at a particular time. Taking the p-driver 6 as an example, if the voltage at gate 10 is at least a threshold voltage ($V_T$) below one of the other terminals, the highest voltage terminal will be the source. Thus, if, for example, pad 5 is at five volts and the voltage at gate 10 is $V_T$ less than 5 volts, the pad terminal of p-driver 6 becomes the source and the drain is connected to $V_{ccp}$, thereby creating a DC current sink in the power supply. Conversely, under normal operation, the source will be the terminal connected to $V_{ccp}$.

Resistors 11 and 12 provide electrostatic discharge (ESD) protection for the circuit. High voltage bias transistor 7 is used to prevent the DC current sink in the power supply discussed above in connection with the p-driver. The gate of the high voltage bias transistor is tied to $V_{cc}$. Accordingly, when the pad voltage exceeds $V_{cc}$ by $V_T$, the pad voltage appears at the gate of the p-driver. Because the pad voltage appears at the gate 10 of the p-driver 6, there is not a $V_T$ drop between the pad and the gate of the p-driver, the p-driver remains off and no current is sourced to $V_{cc}$ through the p-driver. Additionally, because gate 13 of the p-transistor 9 of the passgate 14 is connected to the pad, the pad voltage appears at the gate 13 of the p-transistor 9 and keeps the p-transistor 9 turned off. This prevents a high voltage signal from being driven back into the p-predriver 1 and further into the internal components (not shown).

N-type transistors 3 and 4 form an n-driver stack and are driven by the n-predriver 2. N-transistor 4 is gate coupled to the N-predriver 2 and source coupled to $V_{ssp}$. $V_{ssp}$ is typically ground. Transistor 3 is gate coupled to $V_{cc}$. Accordingly, the maximum voltage that can appear at the intermediate node in the stack is $V_{cc}-V_T$. Thus, the high voltage is effectively stopped at the passgate and in the n-driver stack.

In the course of normal operation, to drive the pad 5 to $V_{ccp}$, the gates of the n-driver 4 and p-driver 6 must be driven low. To drive the pad 5 low, both drivers' gates must be driven high. To float the pad 5 and go into tri-state, both drivers 4, 6 must be turned off. Therefore, the p-driver gate 10 must be driven high, and the gate of the n-driver 4 must be driven low. This creates an indeterminate condition at the pad 5. When in tri-state, it is often desirable to know the state of the pad 5, e.g., it is desirable to pull the pad 5 high or pull the pad 5 low so that when the pad 5 is not being driven, it is in a known state. One way this is typically done is by using a weak resistor as a pull-down resistor 15 or pull-up resistor (not shown). A pull-down resistor 15 from the pad to ground is shown for illustration. Leakage current from the p-driver 6 can prevent the desired pull-down. Moreover, if the p-driver 6 leaks, this leakage represents a power waste, both in terms of the current sourced by the p-driver 6, but also because external devices have to drive back that much harder against this leakage current to successfully drive the pad 5. While power waste is undesirable in any event, it can be devastating in low power systems, including mobile systems.

The prior art circuit exhibits leakage in the p-output path under certain conditions. Specifically, failure conditions exist when the pad 5 is driven to a logic 1 which implies that the gate of the n-driver 4 is low and the p-driver gate 10 is low. Therefore, 3.3 volts appear at the pad 5, and the same 3.3 volts appear at the p-gate 13 of the passgate 14. Thus, the p-transistor 9 of the passgate 14 is turned off. However, the n-transistor 8 has no trouble sourcing a zero volt signal to the gate 10 of the p-driver 6. Thus, the p-driver 6 is on, and the pad 5 is driven high. A problem occurs in the transition from a pad high condition to a tri-state. To float the pad 5, the gate 10 of the p-driver 6 must be driven high to shut the p-driver 6 off. Unfortunately, one can only drive a voltage up to a $V_{cc}-V_T$ through the n-transistor 8 of the passgate 14. The p-transistor 9 of the passgate 14 remains off because the 3.3 volts of the pad 5 continue to appear at its gate 13. Since the maximum voltage that can be driven through the n-transistor 8 is less than the voltage required to turn the p-driver 6 off, a leakage path exists from $V_{ccp}$ through p-driver 6 through the pull-down resistor 15 to ground. Therefore, a leakage current results until the voltage at the pad 5 is reduced enough to allow the p-transistor 9 of the passgate 14 to turn on, and 3.3 volts can be sourced to a gate of the p-driver 6 shutting the p-driver 6 off. Unfortunately, a weak pull-down resistor may not be strong enough to drag the pad 5 low enough to turn the p-transistor 9 of the passgate 14 on.

To reduce this unnecessary power drain and to ensure that the pad 5 can be placed in a known state when not driven, it would be desirable to be able to prevent this leakage current while still protecting the internal circuitry from high voltages of external drivers.

BRIEF SUMMARY OF THE INVENTION

A method and apparatus for reducing leakage currents in a high voltage tolerant I/O buffer is disclosed. An I/O buffer designed to tolerate high external voltages by blocking such voltages at a passgate in a p-output path that uses a device between a p-driver gate node and a p-gate node of the passgate to ensure that the p-transistor of the passgate is turned on when the p-driver is driving the pad high. A second device isolates the p-gate node of the passgate from the pad until a pad voltage reaches a predetermined level. Once the pad voltage reaches the predetermined level, the device drives the voltage at the p-gate node of the passgate to that of the pad. Maintaining the p-transistor of the passgate on while the p-driver is driving the pad high allows a rapid hard shut-off of the p-driver as the I/O buffer tri-states the pad. Additionally, the second device maintains the necessary voltage protection by insuring a hard shut-off of the p-transistor of the passgate when the voltage at the pad reaches a predetermined level.

DETAILED DESCRIPTION OF THE INVENTION

Figure 1:
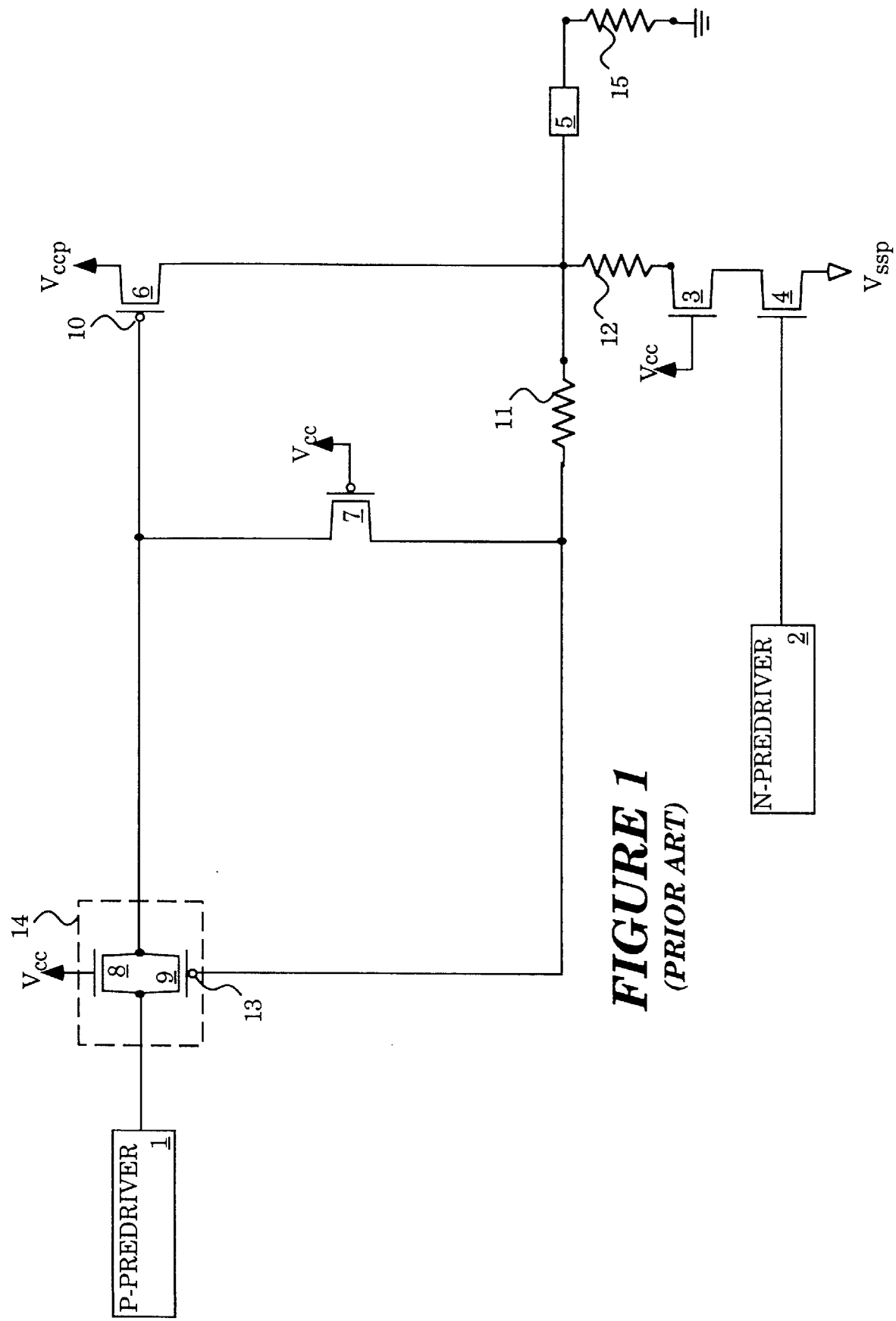
FIG. 1 shows a schematic diagram of a prior art p-output path of an I/O buffer.
Figure 2:
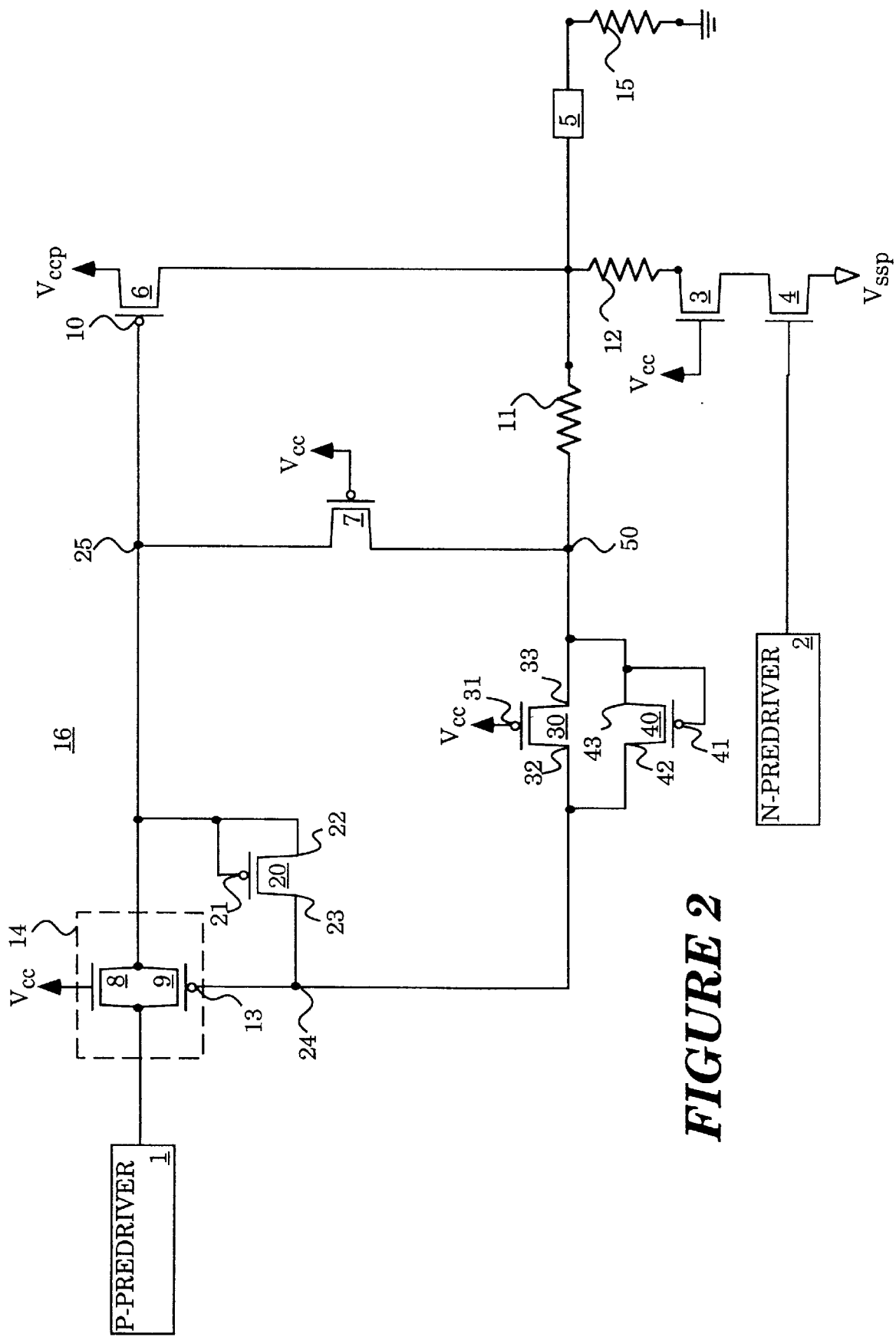
FIG. 2 shows a schematic diagram of one embodiment of the p-output path of an I/O buffer of the invention.

FIG. 2 shows an embodiment of the invention in which three additional transistors are added to the existing p-out path to eliminate leakage currents while still maintaining necessary voltage protection for the sensitive internal circuitry. Here, also, the p-output path has the p-predriver 1 driving a passgate 14 including n-transistor 8 and p-transistor 9 with sources coupled to the p-predriver 1 and drains coupled to p-driver gate node 25. The p-driver 6 has gate 10 coupled to the p-driver gate node and its other terminals coupled to $V_{ccp}$ and the pad 5, respectively. The n-driver stack of transistors 3 and 4 are again driven by n-predriver 2 and the n-output path is the same as in the prior art. Pull-down resistor 15 is coupled to the pad 5 and provides a current path to ground. Resistors 11 and 12 provide ESD protection in the new circuit. Resistors 11 and 12 can be omitted without departing from the scope or contemplation of the invention. High voltage bias transistor 7 is coupled between bias node 50 and p-driver gate node 25 with its gate coupled to $V_{cc}$. High voltage disabling transistor 30 has a gate 31 coupled to $V_{cc}$ and a source 33 coupled to bias node 50 and a drain 32 coupled to p-gate node 24. Diode connected transistor 20 has its gate 21 and its drain 22 coupled to p-driver gate node 25 while the source 23 is coupled to p-gate node 24. A second diode connected transistor 40 may be optionally provided to address certain reliability concerns discussed more fully below. The second diode connected transistor 40 has a gate 41 and drain 43 coupled to bias node 50, while its source 42 is coupled to p-gate node 24.

The first diode connected transistor 20 turns on when p-gate node 24 is higher than p-driver gate node 25 by one threshold voltage. When the p-driver 6 is on, predriver 1 is driving p-driver gate node 25 to a voltage at least one threshold voltage $(V_T)$ below $V_{cc}$ and ideally to 0 to reduce the resistance experienced in the p-driver 6. Therefore, assuming that the p-driver 6 is on and the p-predriver 1 is driving p-driver gate node 25 to 0, diode connected transistor 20 will hold node 24 at $V_T$. Since gate 13 of p-type transistor 9 sees this voltage $V_T$ when the p-predriver 1 switches to turn off the p-driver 6, p-type transistor 9 is already on and the full 3.3 volts will appear at gate 10 of the p-driver 6 providing a hard shut-off.

High voltage disabling transistor 30 performs two functions. First, it isolates the p-gate node 24 from the voltage appearing on pad 5. This allows diode connected transistor 20 to control the voltage at p-gate node 24 as discussed above. Secondly, because gate 31 of the high voltage disabling transistor 30 is coupled to $V_{cc}$, the transistor 30 is only turned on if the voltage at terminal 32 or 33 exceeds Vcc by $V_T$. In this design, such will only happen if an external agent drives pad 5 above $V_{cc}$, for example, to 5 volts. Once the voltage at bias node 50 exceeds $V_{cc}+V_T$, high voltage disabling transistor 30 passes that voltage to p-gate node 24, turning off the p-transistor 9 of the passgate 14. Simultaneously, high voltage bias transistor 7 conveys that voltage from bias node 50 to p-driver gate node 25 which prevents leakage through the p-driver 6 to $V_{ccp}$.

The second diode connected transistor 40 is optional and is provided to improve reliability and performance. Specifically, when the pad 5 is driven low (either by the n-output path or an external driver), p-gate node 25 is driven high to shut off p-driver 6, diode connected transistor 20 is thereby also turned off and control of the voltage at p-gate node 24 is lost. Because p-gate node 24 is isolated from the pad 5, if transistor 40 were omitted, the low voltage on the pad 5 would not be seen by gate 13 of p-transistor 9. Thus, the p-transistor 9 of the passgate 14 may be turned off. If a manufacturing flaw, for example, a filament, exists between p-driver gate node 25 and ground, a resistive short may cause the voltage at p-driver gate node 25 to degrade such that the p-driver 6 begins to leak current Substantial leakage currents may exist before the voltage degrades enough to have diode connected transistor 20 turn on and pull p-gate node 24 to $V_{cc}-V_T$. By providing the second diode connected transistor 40, this concern is eliminated. Specifically, a 0 on the pad appears at bias node 50 and, therefore, drain 43 and gate 41 of second diode connected transistor 40. This has the effect of pulling the voltage at p-gate node 24 to $V_T$ above the pad voltage when the pad 5 is low. Thus, the p-transistor 9 of the pass gate is held on and the voltage at the p-driver gate node 25 does not degrade. Accordingly, the p-driver 6 remains off, and no leakage occurs.

In an alternative embodiment, either or both diode connected transistors 20 and 40 could be replaced each with a diode. Similarly, as discussed above, the second diode connected transistor 40 could be omitted entirely and a diode could be substituted for diode connected transistor 20. Moreover, either device could be replaced with an n-type device with respective gates coupled to p-gate node 24.

Figure 3:
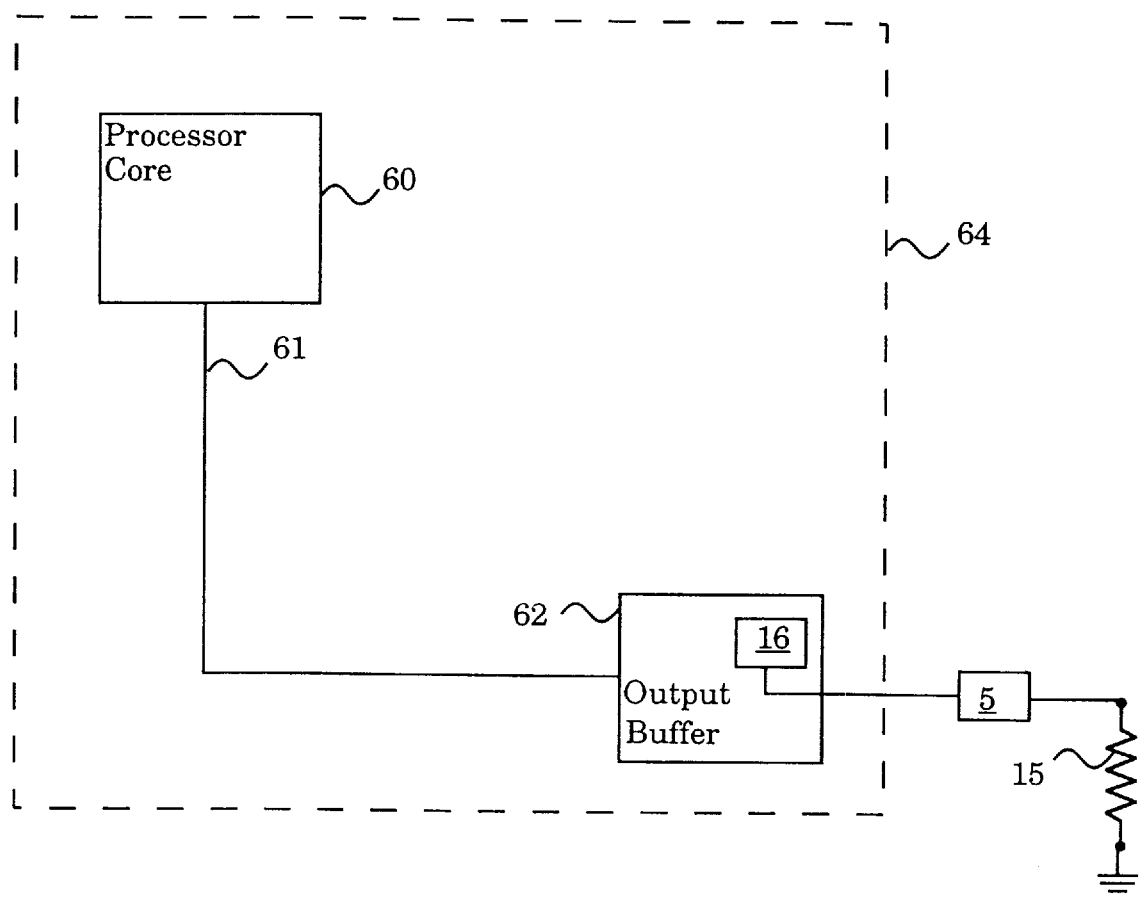
FIG. 3 shows a block diagram of an integrated circuit incorporating one embodiment of the invention.

FIG. 3 shows a block diagram of an integrated circuit 64 using the invention. Processor core 60 is coupled to output buffer 62 by output line 61. Output buffer 62 includes the p-output path 16 of the instant invention. P-output path 16 is coupled to pad 5 which is coupled to pull-down resistor 15 for purposes of example. The processor 60 could be any well-known processor. Moreover, other devices having I/O capabilities may be coupled to the output buffer instead of a processor core. Integrated circuit 64 is fabricated by known techniques. It will be understood by one of ordinary skill in the art that any of the embodiments described above could be used for the p-output path 16 in an integrated circuit.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method of reducing leakage currents in a p-type output path comprising the steps of:

holding a voltage at a p-gate node of a passgate at a voltage approximately one threshold voltage above a voltage at a gate of a p-driver when the p-driver is on, the threshold voltage being the threshold voltage of an element coupled between the p-gate node and the gate of the p-driver; and driving the p-gate node of the passgate to a pad voltage when the pad voltage exceeds a supply voltage by one threshold voltage of an element coupled between the pad and the p-gate node.

2. The method of claim 1 wherein the step of holding comprises the step of:

providing a diode coupled transistor between the p-gate node and the p-driver gate node.

3. The method of claim 1 further comprising the step of:

pulling the p-gate node to a predetermined voltage above the pad voltage when the pad voltage is driven low.

4. An apparatus comprising:

a passgate including an n-transistor and a p-transistor, each having a gate, a source, and a drain, the respective sources coupled to a source node and the respective drains coupled to a p-driver gate node;

a p-driver having a gate and a drain, the drain of the p-driver coupled to a pad;

a diode connected transistor coupled between the p-driver gate node and a p-gate node of the passgate; and a high voltage disabling transistor having a gate coupled to a supply voltage, a drain coupled to the p-gate node, and a source coupled to a bias node.

5. The apparatus of claim 4 further comprising:

a second diode connected transistor having a gate and a drain coupled to the bias node and a source coupled to the p-gate node.

6. The apparatus of claim 5, wherein the first diode connected transistor, the second diode connected transistor, and the high voltage disabling transistor are all p-type MOS transistors.

7. An improved output buffer having a p-pre-driver driving a pass gate, the pass gate coupled to a gate of a p-driver, a drain of the p-driver coupled to a pad; the improvement comprising:

means for holding a p-gate node of a p-transistor of the pass gate at a voltage less than or equal to one threshold voltage, of an element coupled between a p-driver gate node and the p-gate node, above a voltage at the gate of the p-driver while the pre-driver is driving a low signal through the pass gate; and means for driving the p-gate node of the pass gate to a pad voltage if the pad voltage exceeds a predetermined voltage.

8. The improvement of claim 7 further comprising:

means for pulling the p-gate node voltage to a voltage one threshold voltage of a diode-like element coupled between the p-gate node and the pad above a voltage at the pad when the pad is driven low.

9. The improvement of claim 8 wherein the means for holding, the means for driving, and the means for pulling are each p-type MOS transistors.

10. The improvement of claim 7 wherein the means for holding is a diode coupled between the p-driver gate node and the p-gate node of the passgate.

11. The improvement of claim 8 wherein the means for pulling is a diode coupled between a bias node and the p-gate node of the passgate.

12. An integrated circuit including an output buffer, said output buffer comprising:

a passgate including an n-transistor and a p-transistor, each having a gate, a source, and a drain, the respective sources coupled to a source node and the respective drains coupled to a p-driver gate node;

a p-driver having a gate and a drain, the drain of the p-driver coupled to a pad;

a diode connected transistor coupled between the p-driver gate node and a p-gate node of the passgate; and a high voltage disabling transistor having a gate coupled to a supply voltage, a drain coupled to the p-gate node, and a source coupled to a bias node.

13. The integrated circuit of claim 12 further comprising:

a second diode connected transistor having a gate and a drain coupled to the bias node and a source coupled to the p-gate node.

14. The integrated circuit of claim 13 wherein the first diode connected transistor, the second diode connected transistor, and the high voltage disabling transistor are all p-type MOS transistors.

* * * * *